United States Patent
Nagai

(10) Patent No.: US 11,139,304 B2
(45) Date of Patent: Oct. 5, 2021

(54) MANUFACTURING METHOD OF SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/732,355

(22) Filed: Jan. 2, 2020

(65) Prior Publication Data

US 2020/0152636 A1 May 14, 2020

Related U.S. Application Data

(62) Division of application No. 15/889,161, filed on Feb. 5, 2018, now Pat. No. 10,559,570.

(30) Foreign Application Priority Data

Jan. 18, 2018 (CN) .......................... 201810047868.5

(51) Int. Cl.
*H01L 21/768* (2006.01)
*H01L 21/311* (2006.01)
(Continued)

(52) U.S. Cl.
CPC .. *H01L 27/10855* (2013.01); *H01L 21/76877* (2013.01); *H01L 21/76897* (2013.01);
(Continued)

(58) Field of Classification Search
CPC .................................................. H01L 21/76885
See application file for complete search history.

(56) References Cited

U.S. PATENT DOCUMENTS 9,508,726 B2 11/2016 Son
9,607,994 B2 3/2017 Kim
(Continued)

FOREIGN PATENT DOCUMENTS

CN 1519917 A 8/2004
CN 1577805 A 2/2005
(Continued)

OTHER PUBLICATIONS

Park, 20nm DRAM: A new beginning of another revolution, Electron Devices Meeting (IEDM) 2015, Dec. 7, 2015.

*Primary Examiner* — Omar F Mojaddedi
(74) *Attorney, Agent, or Firm* — Winston Hsu

(57) ABSTRACT

A semiconductor memory device includes a semiconductor substrate, bit line structures, storage node contacts, and isolation structures. The bit line structures, the storage node contacts, and the isolation structures are disposed on the semiconductor substrate. Each bit line structure is elongated in a first direction, and the bit line structures are repeatedly disposed in a second direction. Each storage node contact and each isolation structure are disposed between two of the bit line structures adjacent to each other in the second direction. Each storage node contact is disposed between two of the isolation structures disposed adjacent to each other in the first direction. Each isolation structure includes at least one first portion elongated in the first direction and partially disposed between one of the bit line structures and one of the storage node contacts adjacent to the isolation structure in the second direction.

7 Claims, 21 Drawing Sheets

(51) Int. Cl.
*H01L 21/764* (2006.01)
*H01L 21/02* (2006.01)
*H01L 27/108* (2006.01)

(52) U.S. Cl.
CPC .. *H01L 27/10814* (2013.01); *H01L 27/10823* (2013.01); *H01L 27/10885* (2013.01); *H01L 27/10888* (2013.01); *H01L 21/31111* (2013.01); *H01L 21/76885* (2013.01)

(56) References Cited

U.S. PATENT DOCUMENTS

| | | | |
|---|---|---|---|
| 2003/0001180 A1 | 1/2003 | Narimatsu | |
| 2004/0147114 A1 | 7/2004 | Park | |
| 2004/0266101 A1 | 12/2004 | Park | |
| 2012/0012911 A1* | 1/2012 | Jeong | H01L 21/76877 257/301 |
| 2012/0193696 A1 | 8/2012 | Fukushima | |
| 2012/0248519 A1 | 10/2012 | Shinhara | |
| 2013/0320549 A1* | 12/2013 | Lee | H01L 21/7682 257/773 |
| 2013/0344666 A1* | 12/2013 | Moon | H01L 27/10823 438/259 |
| 2015/0061134 A1* | 3/2015 | Lee | H01L 21/76895 257/751 |
| 2015/0126013 A1 | 5/2015 | Hwang | |
| 2015/0228574 A1 | 8/2015 | Kim | |
| 2015/0255466 A1 | 9/2015 | Hwang | |
| 2017/0025438 A1* | 1/2017 | Lee | H01L 29/78642 |
| 2017/0062347 A1* | 3/2017 | Kim | H01L 21/76897 |

FOREIGN PATENT DOCUMENTS

| | | |
|---|---|---|
| CN | 102339829 A | 2/2012 |
| CN | 102768848 A | 11/2012 |
| CN | 106783743 A | 5/2017 |

\* cited by examiner

MANUFACTURING METHOD OF SEMICONDUCTOR MEMORY DEVICE

CROSS REFERENCE TO RELATED APPLICATIONS

This application is a division of application Ser. No. 15/889,161 filed on Feb. 5, 2018, now allowed, which is incorporated by reference herein in its entirety.

BACKGROUND OF THE INVENTION

1. Field of the Invention

The present invention relates to a semiconductor memory device and a manufacturing method thereof, and more particularly, to a semiconductor memory device for reducing parasitic capacitance and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

According to demands of products, the need to continuously increase the density of the memory cells in the array leads to more difficult and complex processes and design. For example, when the density of the memory cells increases, the distance between components in the memory cell becomes smaller and the influence of parasite capacitance becomes more obvious. Therefore, the related industries keep making efforts to design new structures and/or processes in order to reduce the parasite capacitance for improving the performance of the memory device.

SUMMARY OF THE INVENTION

It is one of the objectives of the present invention to provide a semiconductor memory device and a manufacturing method thereof. Isolation structures partially elongated for being disposed between bit line structures and storage node contacts and/or storage node contacts including protruding portions extending towards the bit line structures may be used to reduce the parasite capacitance between the bit line structures and the storage node contacts.

A semiconductor memory device is provided by an embodiment of the present invention. The semiconductor memory device includes a semiconductor substrate, bit line structures, storage node contacts, and isolation structures. The bit line structures, the storage node contacts, and the isolation structures are disposed on the semiconductor substrate. Each of the bit line structures is elongated in a first direction, and the bit line structures are repeatedly disposed in a second direction. Each of the storage node contacts and each of the isolation structures are disposed between two of the bit line structures adjacent to each other in the second direction. Each of the storage node contacts is disposed between two of the isolation structures disposed adjacent to each other in the first direction. Each of the isolation structures comprises at least one first portion elongated in the first direction and partially disposed between one of the bit line structures disposed adjacent to the isolation structure and one of the storage node contacts disposed adjacent to the isolation structure in the second direction.

A manufacturing method of a semiconductor memory device is provided in an embodiment of the present invention. The manufacturing method includes the following steps. A semiconductor substrate is provided. Bit line structures are formed on the semiconductor substrate. Each of the bit line structures is elongated in a first direction, and the bit line structures are repeatedly disposed in a second direction. Storage node contacts are formed on the semiconductor substrate. Each of the storage node contacts is disposed between the bit line structures disposed adjacent to each other in the second direction. Isolation structures are formed on the semiconductor substrate. Each of the isolation structures is disposed between two of the bit line structures disposed adjacent to each other in the second direction. Each of the storage node contacts is disposed between two of the isolation structures disposed adjacent to each other in the first direction. Each of the isolation structures includes at least one first portion elongated in the first direction and partially disposed between one of the bit line structures disposed adjacent to the isolation structure and one of the storage node contacts disposed adjacent to the isolation structure in the second direction.

A semiconductor memory device is provided by another embodiment of the present invention. The semiconductor memory device includes a semiconductor substrate, bit line structures, storage node contacts, and isolation structures. The bit line structures, the storage node contacts, and the isolation structures are disposed on the semiconductor substrate. Each of the bit line structures is elongated in a first direction, and the bit line structures are repeatedly disposed in a second direction. Each of the storage node contacts and each of the isolation structures are disposed between two of the bit line structures adjacent to each other in the second direction. Each of the storage node contacts is disposed between two of the isolation structures disposed adjacent to each other in the first direction. Each of the storage node contacts includes a main portion and two protruding portions disposed at two opposite sides of the main portion in the second direction respectively, and each of the protruding portions extends towards one of the bit line structures disposed adjacent to the storage node contact.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-31 are schematic drawings illustrating a manufacturing method of a semiconductor device according to an embodiment of the present invention, wherein FIG. 6 is a cross-sectional diagram taken along a line A2-A2' in FIG. 5, FIG. 7 is a cross-sectional diagram taken along a line B2-B2' in FIG. 5, FIG. 8 is a schematic drawing in a step subsequent to FIG. 5, FIG. 9 is a cross-sectional diagram taken along a line A3-A3' in FIG. 8, FIG. 10 is a cross-sectional diagram taken along a line B3-B3' in FIG. 8, FIG. 11 is a schematic drawing in a step subsequent to FIG. 8, FIG. 12 is a cross-sectional diagram taken along a line A4-A4' in FIG. 11, FIG. 13 is a cross-sectional diagram taken along a line B4-B4' in FIG. 11, FIG. 14 is a schematic drawing in a step subsequent to FIG. 11, FIG. 15 is a cross-sectional diagram taken along a line A5-A5' in FIG. 14, FIG. 16 is a cross-sectional diagram taken along a line B5-B5' in FIG. 14, FIG. 17 is a cross-sectional diagram taken along a line C5-C5' in FIG. 14, FIG. 18 is a schematic drawing in a step subsequent to FIG. 14, FIG. 19 is a cross-sectional diagram taken along a line A6-A6' in FIG. 18, FIG. 20 is a cross-sectional diagram taken along a line B6-B6' in FIG. 18, FIG. 21 is a schematic drawing in a step subsequent to FIG. 18, FIG. 22 is a cross-sectional diagram taken along a line A7-A7' in FIG. 21, FIG. 23 is a cross-sectional diagram taken along a line B7-B7' in FIG. 21, FIG. 24 is a schematic drawing in a step subsequent to FIG. 21, FIG. 25 is a cross-sectional diagram taken along a line A8-A8' in FIG. 24, FIG. 26 is a cross-sectional diagram taken along a line C8-C8' in FIG. 24, FIG. 27 is a schematic drawing in a step subsequent to FIG. 24, FIG. 28 is a cross-sectional diagram taken along a line A9-A9' in FIG. 27, FIG. 29 is a cross-sectional diagram taken along a line C9-C9' in FIG. 27, FIG. 30 is a schematic drawing in a step subsequent to FIG. 28, and FIG. 31 is a schematic drawing in a step subsequent to FIG. 29.

DETAILED DESCRIPTION

Figure 1:
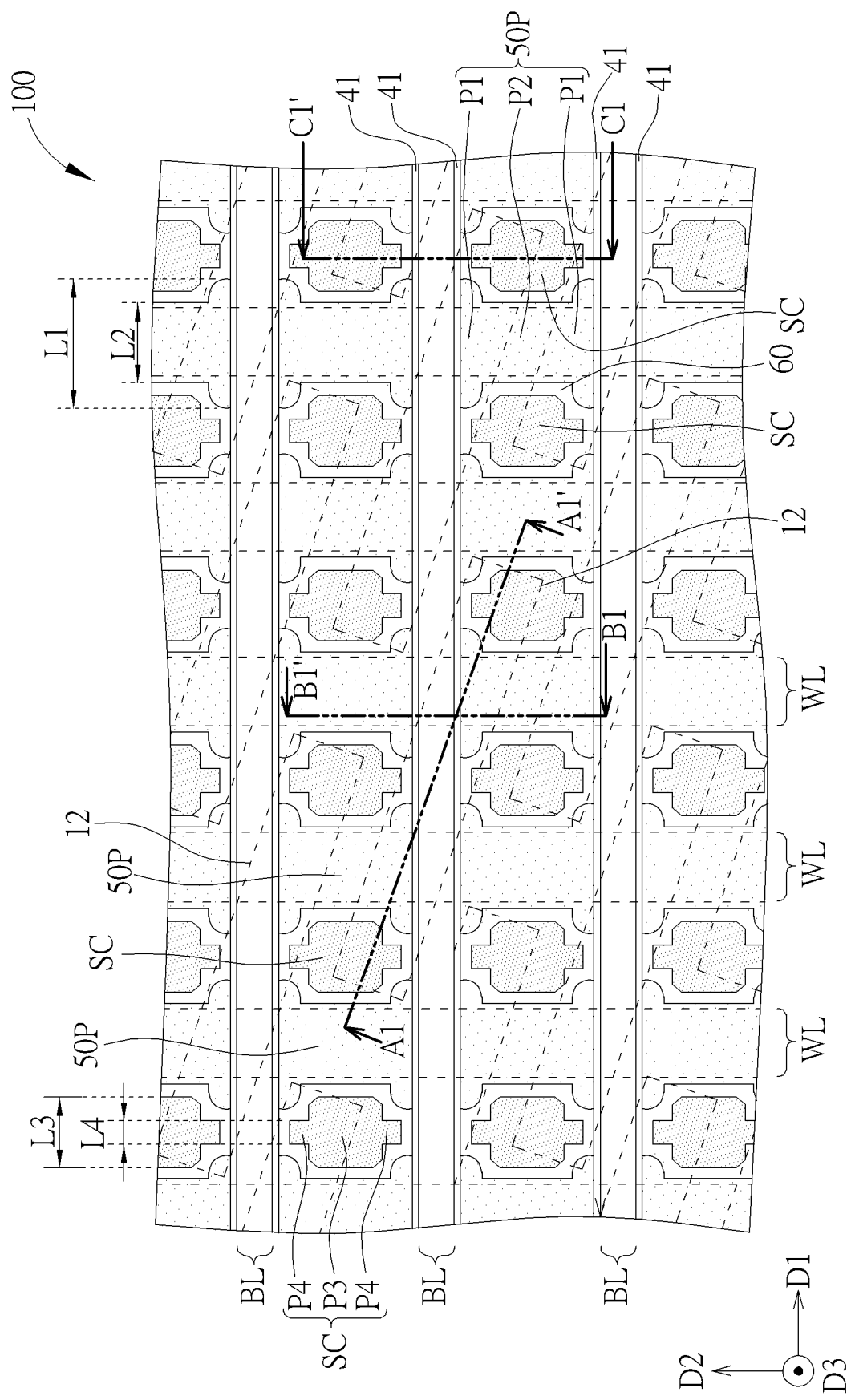
FIG. 1 is a top view schematic drawing illustrating a semiconductor memory device according to an embodiment of the present invention.
Figure 2:
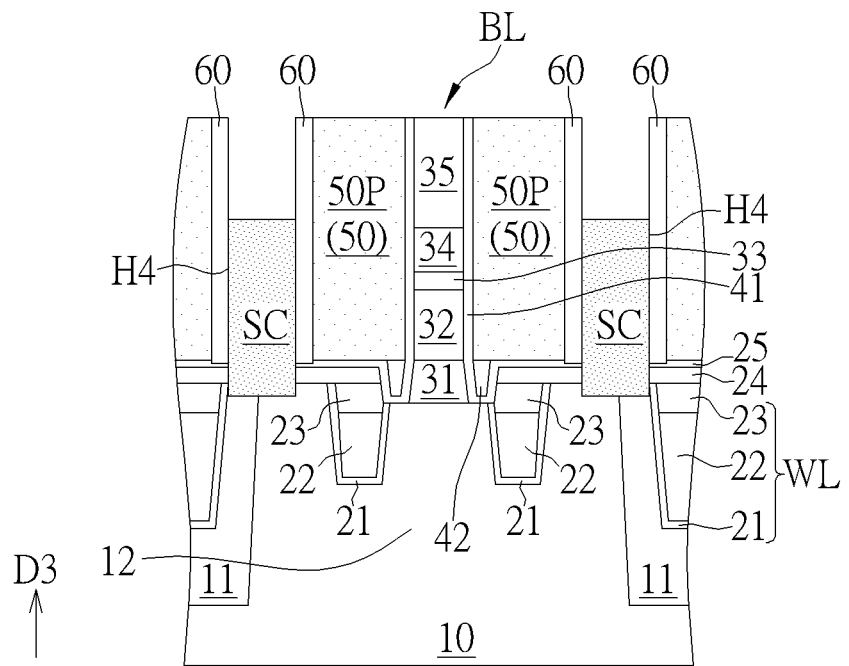
FIG. 2 is a cross-sectional diagram taken along a line A1-A1' in FIG. 1.
Figure 3:
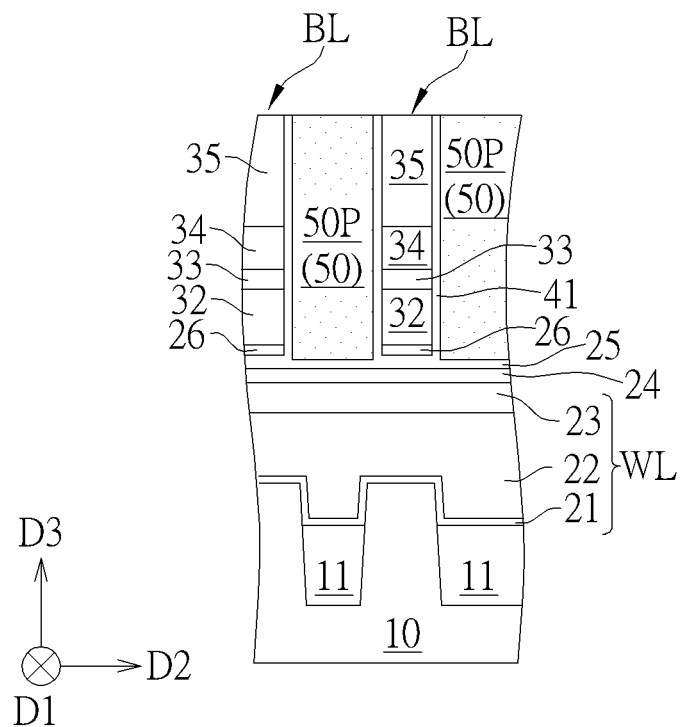
FIG. 3 is a cross-sectional diagram taken along a line B1-B1' in FIG. 1.
Figure 4:
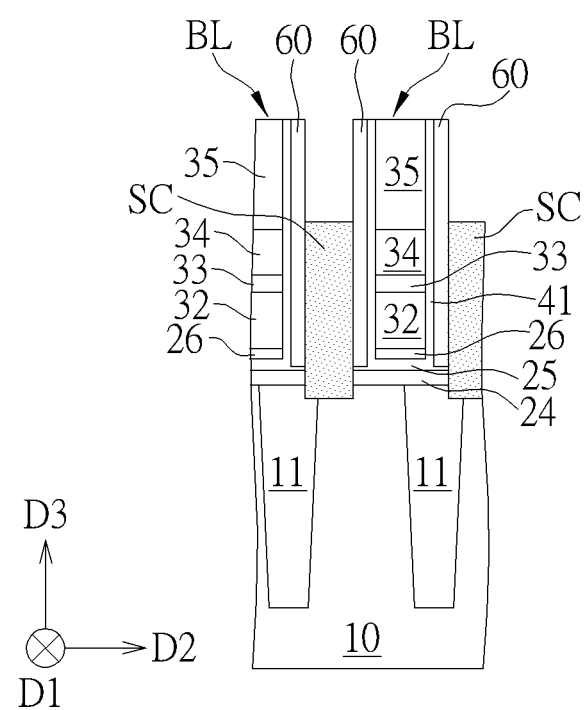
FIG. 4 is a cross-sectional diagram taken along a line C1-C1' in FIG. 1.

Please refer to FIGS. 1-4. FIG. 1 is a top view schematic drawing illustrating a semiconductor memory device according to an embodiment of the present invention. FIG. 2 is a cross-sectional diagram taken along a line A1-A1' in FIG. 1, FIG. 3 is a cross-sectional diagram taken along a line B1-B1' in FIG. 1, and FIG. 4 is a cross-sectional diagram taken along a line C1-C1' in FIG. 1. As shown in FIGS. 1-4, a semiconductor memory device 100 is provided in this embodiment. The semiconductor memory device 100 includes a semiconductor substrate 10, a plurality of bit line structures BL, a plurality of storage node contacts SC, and a plurality of isolation structures 50P. The bit line structures BL, the storage node contacts SC, and the isolation structures 50P are disposed on the semiconductor substrate 10. Each of the bit line structures BL is elongated in a first direction D1, and the bit line structures BL are repeatedly disposed in a second direction D2. In some embodiments, the second direction D2 may be substantially orthogonal to the first direction D1, but not limited thereto. Each of the storage node contacts SC is disposed between two of the bit line structures BL adjacent to each other in the second direction D2, each of the isolation structures 50P is disposed between two of the bit line structures BL adjacent to each other in the second direction D2 also, and each of the storage node contacts SC is disposed between two of the isolation structures 50P disposed adjacent to each other in the first direction D1. Additionally, two of the storage node contacts SC disposed adjacent to each other in the first direction D1 may be separated from each other by one of the isolation structures 50P.

As shown in FIG. 1, each of the isolation structures 50P may include at least one first portion P1 elongated in the first direction D1 and partially disposed between one of the bit line structures BL disposed adjacent to the isolation structure 50P and one of the storage node contacts SC disposed adjacent to the isolation structure 50P in the second direction D2. In other words, the isolation structure 50P may not only be located between two of the storage node contacts SC adjacent to each other in the first direction D1 but also be partially located between the bit line structure BL and the storage node contact SC adjacent to the bit line structure BL in the second direction D2 by the first portion P1 extending outwards for reducing the parasite capacitance between the bit line structure BL and the storage node contact SC. Additionally, each of the storage node contacts SC may include a main portion P3 and two protruding portions P4 disposed at two opposite sides of the main portion P3 in the second direction D2 respectively and directly adjacent to the main portion P3. Each of the protruding portions P4 extends towards one of the bit line structures BL disposed adjacent to the storage node contact SC. Therefore, the distance between the main portion P3 of each of the storage node contacts SC and the bit line structure BL adjacent to the storage node contact SC is larger than the distance between the protruding portion P4 and the adjacent bit line structure BL, and a top view shape of the storage node contact SC may be regarded as a original top view shape, which is similar to a rectangle, modified by recessing four corners of the rectangle inwards. Therefore, compared with the storage node contact having a op view shape similar to a rectangle, the storage node contact SC in this embodiment may be used to reduce the portion which is too close to the adjacent bit line structure BL, and the purpose of reducing the parasite capacitance between the bit line structure BL and the storage node contact SC may be achieved accordingly.

As shown in FIG. 1, each of the isolation structures 50P may include two first portions P1 and a second portion P2 disposed between the two first portions P1 in the second direction D2, and the second portion P2 is directly connected with the two first portions P1. A length of each of the first portions P1 in the first direction D1 (such as a first length L1 shown in FIG. 1) is longer than a length of the second portion P2 in the first direction D1 (such as a second length L2 shown in FIG. 1). Therefore, two ends of each of the first portions P1 in the first direction D1 may be located between the bit line structure BL adjacent to the isolation structure 50P and two adjacent storage node contacts SC respectively, and each of the isolation structures 50P may include an I-shaped structure in a top view diagram of the semiconductor memory device 100, but not limited thereto. Additionally, in each of the storage node contacts SC, a length of each of the protruding portions P4 in the first direction D1 (such as a fourth length L4 shown in FIG. 1) is shorter than a length of the main portion P3 in the first direction D1 (such as a third length L3 shown in FIG. 1). In other words, the width of each of the protruding portions P4 may be obviously smaller than the width of the main portion P3. A part of at least one of the storage node contacts SC may be disposed between two first portions P1 of the isolation structure 50P disposed adjacent to this storage node contact SC. For example, two ends of the main portion P3 of each of the storage node contacts SC may be respectively disposed between the first portions P1 of the adjacent isolation structures 50P in the second direction D2, but not limited thereto. In addition, each of the protruding portions P4 of each storage node contact SC may be partially disposed between the first portions P1 of two of the isolation structures 50P disposed adjacent to this storage node contact SC in the first direction D1. In other words, the shape of the storage node contact SC is influenced by the shape of the isolation structures 50P, and the storage node contact SC still need to have a specific size under the limitation of the shape of the isolation structures 50P for preventing the influence of storage node contacts having too small area on the manufacturing yield and the process window in the subsequent process of forming storage nodes or other connection structures on the storage node contacts SC.

Additionally, in some embodiments, the semiconductor memory device 100 may further include a liner 60 surrounding each of the storage node contacts SC. The liner 60 may be partly disposed between each of the storage node contacts SC and one of the bit line structures BL disposed adjacent to this storage node contact SC in the second direction D2 and partly disposed between each of the storage node contacts SC and one of the isolation structures 50P disposed adjacent to this storage node contact SC in the first direction D1. In some embodiments, the liner 60 disposed between each of the storage node contacts SC and one of the bit line structures BL disposed adjacent to this storage node contact SC in the second direction D2 is disposed between the first portions P1 of two of the isolation structures 50P disposed adjacent to this storage node contact SC in the first direction D1.

Specifically, as shown in FIGS. 1-4, a shallow trench isolation 11 may be formed in the semiconductor substrate 10 for defining a plurality of active regions 12. The shallow trench isolation 11 may include a single layer or multiple layers of insulation material, such as silicon nitride, silicon oxynitride, silicon carbonitride (SiCN), or other suitable insulation materials. The semiconductor substrate 10 may include a silicon substrate, an epitaxial substrate, a silicon germanium substrate, a silicon carbide substrate, or a silicon-on-insulator (SOI) substrate, but not limited thereto. Each of the bit line structures BL may be electrically connected with the corresponding active region 12 via a contact hole (such as a contact hole CH shown in FIG. 6). In some embodiments, each of the bit line structures BL may include a bit line contact 31, a first conductive layer 32, a barrier layer 33, a second conductive layer 34, and a first bit line cap layer 35 stacked in a thickness direction of the semiconductor substrate 10 (such as a third direction D3 shown in FIGS. 1-4), but not limited thereto. The bit line contact 31 and the first conductive layer 32 may include non-metal conductive materials, such as polysilicon, amorphous silicon, or other non-metal conductive materials containing silicon or not. The barrier layer 33 may include titanium (Ti), tungsten silicide (WSi), tungsten nitride (WN), or other appropriate barrier materials. The second conductive layer 34 may include aluminum, tungsten, copper, titanium aluminide (TiAl), or other suitable metal conductive materials with low electrical resistivity. The first bit line cap layer 35 may include silicon nitride, silicon oxynitride, silicon carbonitride (SiCN), or other suitable insulation materials. The storage node contact SC may be electrically connected to the corresponding active region 12, and the storage node contacts SC may be formed by filling openings (such as fourth openings H4 shown in FIG. 2) surrounded by the isolation structures 50P and the bit line structures BL with a conductive material and performing an etching back process to the conductive material. Therefore, the topmost surfaces of the storage node contacts SC may be lower than the topmost surfaces of the isolation structures 50P, but not limited thereto. Additionally, the storage node contacts SC may include silicon, such as amorphous silicon, polysilicon, or other conductive materials containing silicon. However, in some embodiments, the storage node contacts SC may also be formed by other materials and/or other manufacturing processes according to other considerations.

Word line structures WL may be formed in the semiconductor substrate 10, and the word line structures WL in this embodiment may be buried word lines, but not limited thereto. Each of the word line structures WL may be elongated in the second direction D2, and each of the word line structures WL may include a word line dielectric layer 21, a word line 22, and a word line cap layer 23, but not limited thereto. Trenches may be formed in the semiconductor substrate 10, and the word line dielectric layer 21, the word line 22, and the word line cap layer 23 mentioned above may be sequentially formed in the trench, but not limited thereto. In some embodiments, the other types of word line structures may also be applied according to other considerations. Additionally, the word line dielectric layer 21 may include silicon oxide or other suitable dielectric materials, the word line 22 may include aluminum, tungsten, copper, titanium aluminide, or other suitable conductive materials, and the word line cap layer 23 may include silicon nitride, silicon oxynitride, silicon carbonitride, or other suitable insulation materials. Mask layers such as a first mask layer 24, a second mask layer 25, and a third mask layer 26 may be disposed on the word line structures WL, and the contact hole CH mentioned above may penetrate the first mask layer 24 and the second mask layer 25 for partially exposing the active region 12 corresponding to the bit line structure BL. Additionally, spacer layers, such as s first spacer layer 41 and a second spacer layer 42 may be formed on sidewalls of the bit line structures BL. The first spacer layer 41 and the second spacer layer 42 may be partially disposed in the contact hole CH. The materials of the isolation structures 50P, the liner 60, the first mask layer 24, the second mask layer 25, the third mask layer 26, the first spacer layer 41, and the second spacer layer 42 may respectively include silicon nitride, silicon oxynitride, silicon carbonitride, or other suitable insulation materials, and the materials of the above mentioned parts may be modified according to process requirements, such as a requirement for etching selectivity.

Please refer to FIGS. 1-31. FIGS. 5-31 are schematic drawings illustrating a manufacturing method of a semiconductor device according to an embodiment of the present invention, and FIGS. 1-4 may be regarded as schematic drawings in a step subsequent to FIG. 30. As shown in FIGS. 1-4, the manufacturing method of the semiconductor memory device in this embodiment may include the following steps. Firstly, the semiconductor substrate 10 is provided. The bit line structures BL are formed on the semiconductor substrate 10. Each of the bit line structures BL is elongated in the first direction D1, and the bit line structures BL are repeatedly disposed in the second direction D2. The storage node contacts CS and the isolation structures 50P are formed on the semiconductor substrate 10. Each of the storage node contacts CS is disposed between the bit line structures BL disposed adjacent to each other in the second direction D2, and each of the isolation structures 50P is also disposed between two of the bit line structures BL disposed adjacent to each other in the second direction D2. Each of the storage node contacts CS is disposed between two of the isolation structures 50P disposed adjacent to each other in the first direction D1. Each of the isolation structures 50P includes at least one first portion P1 elongated in the first direction D1 and partially disposed between one of the bit line structures BL disposed adjacent to this isolation structure 50P and one of the storage node contacts SC disposed adjacent to this isolation structure 50P in the second direction D2.

Figure 5:
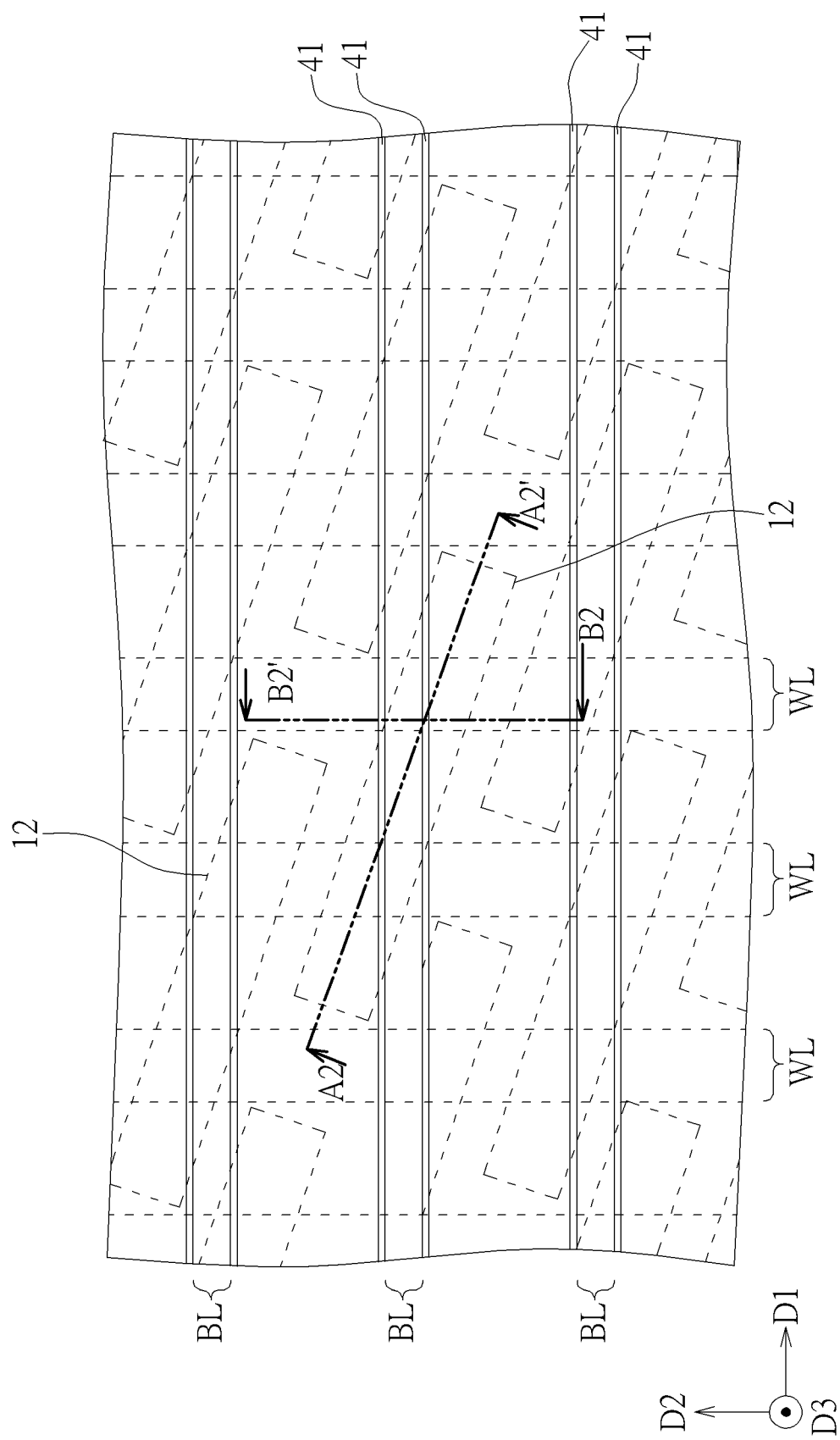
Figure 6:
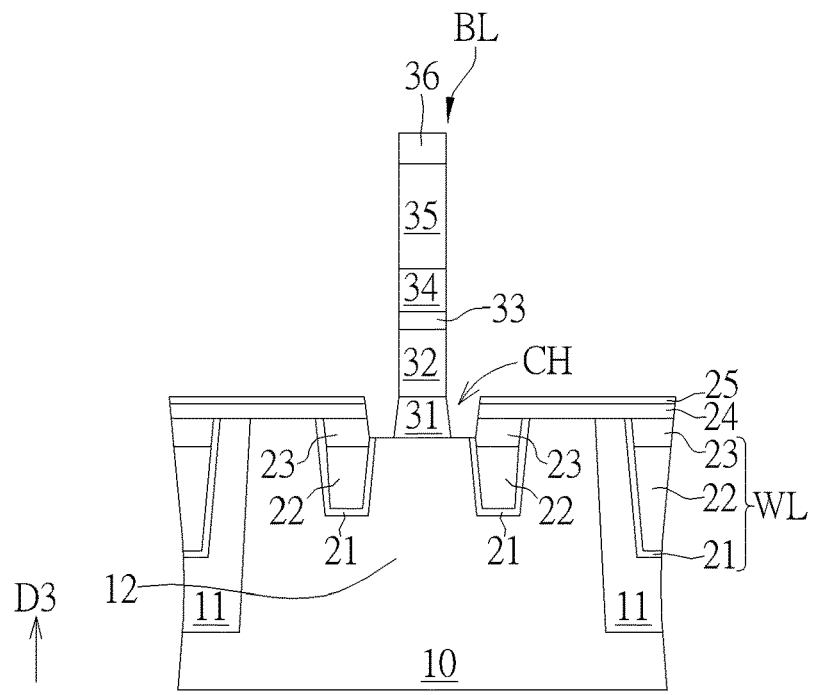
Figure 7:
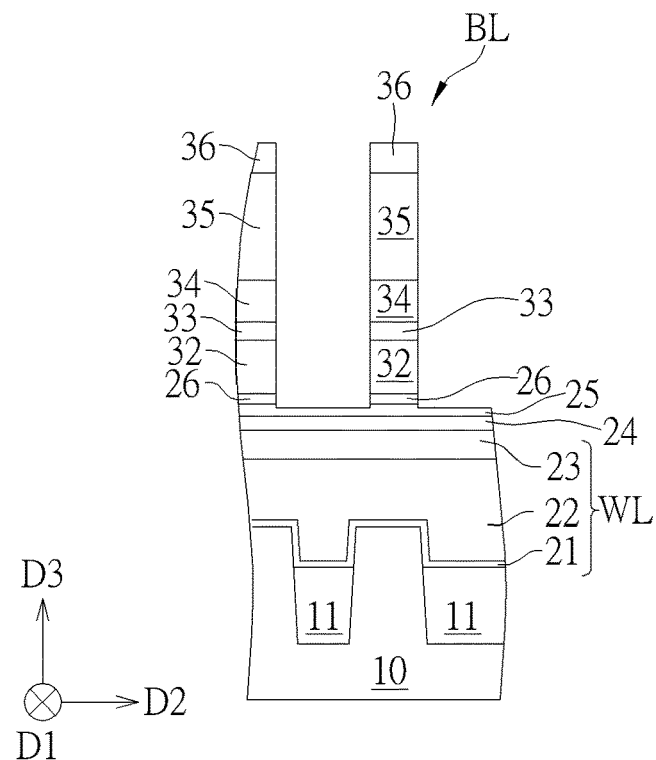
Figure 8:
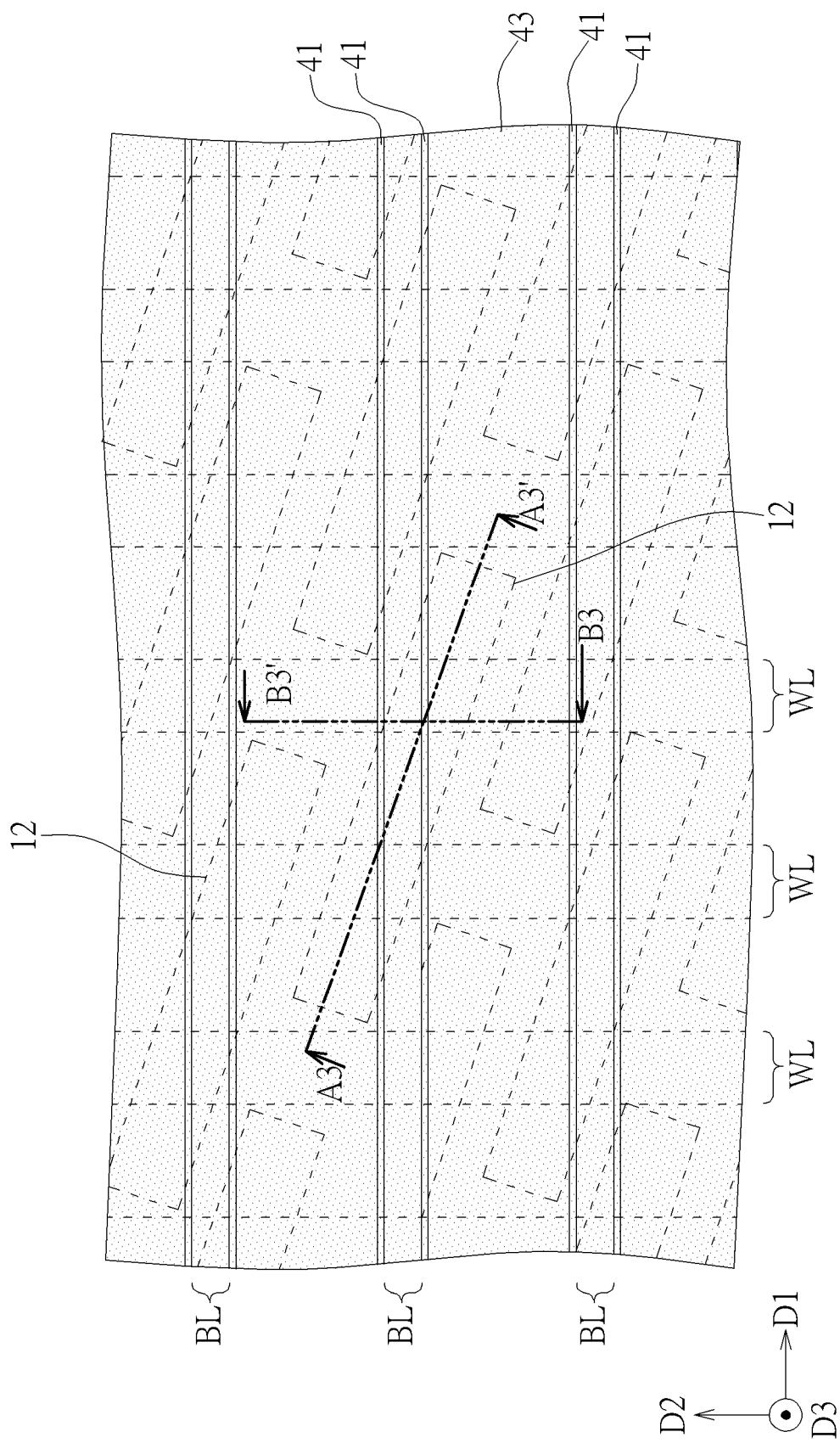
Figure 9:
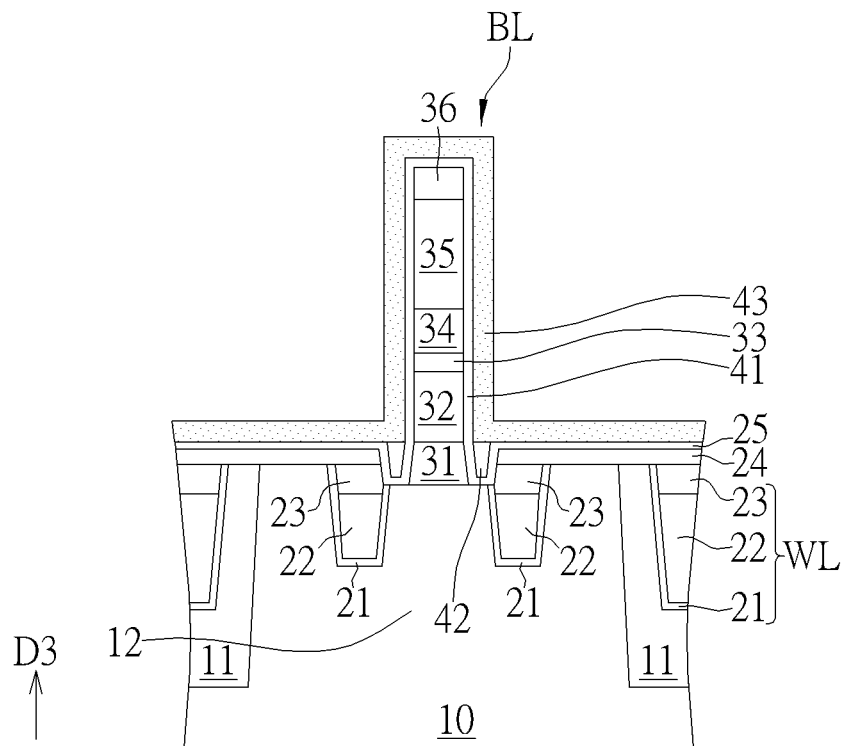
Figure 10:
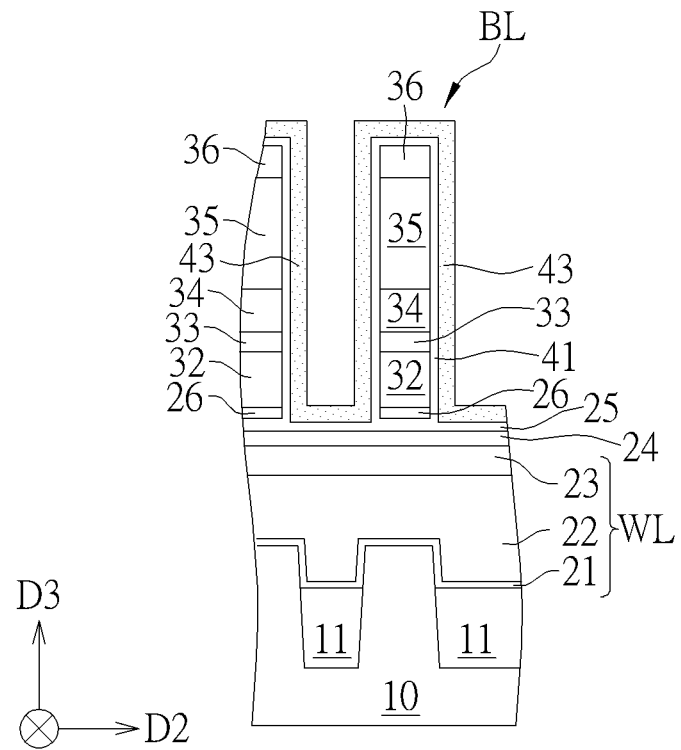
Figure 11:
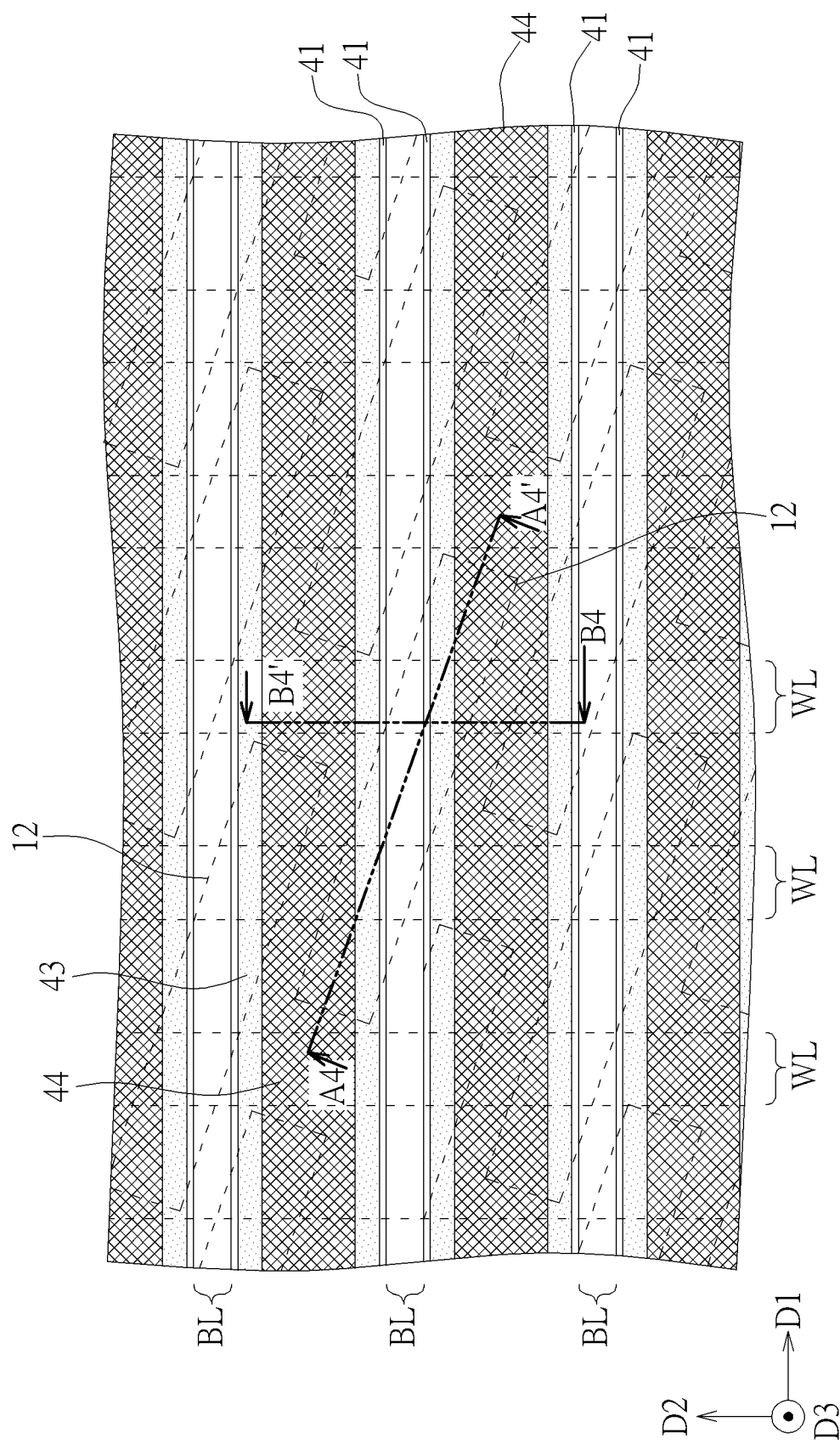
Figure 12:
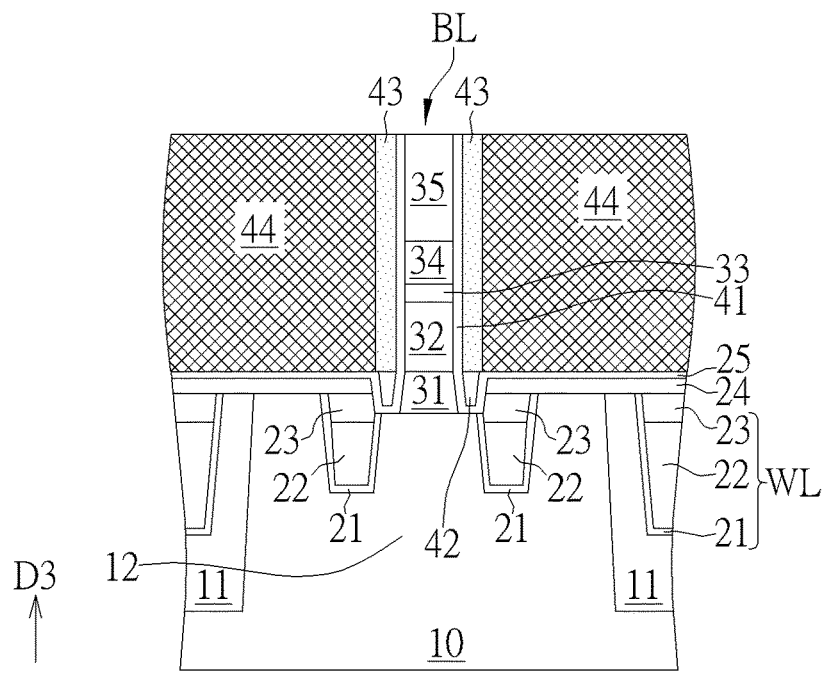
Figure 13:
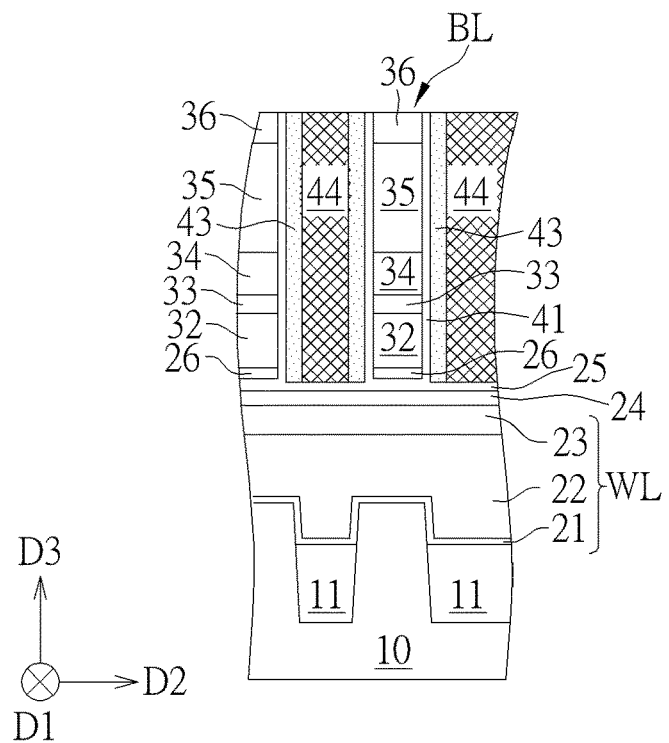
Figure 14:
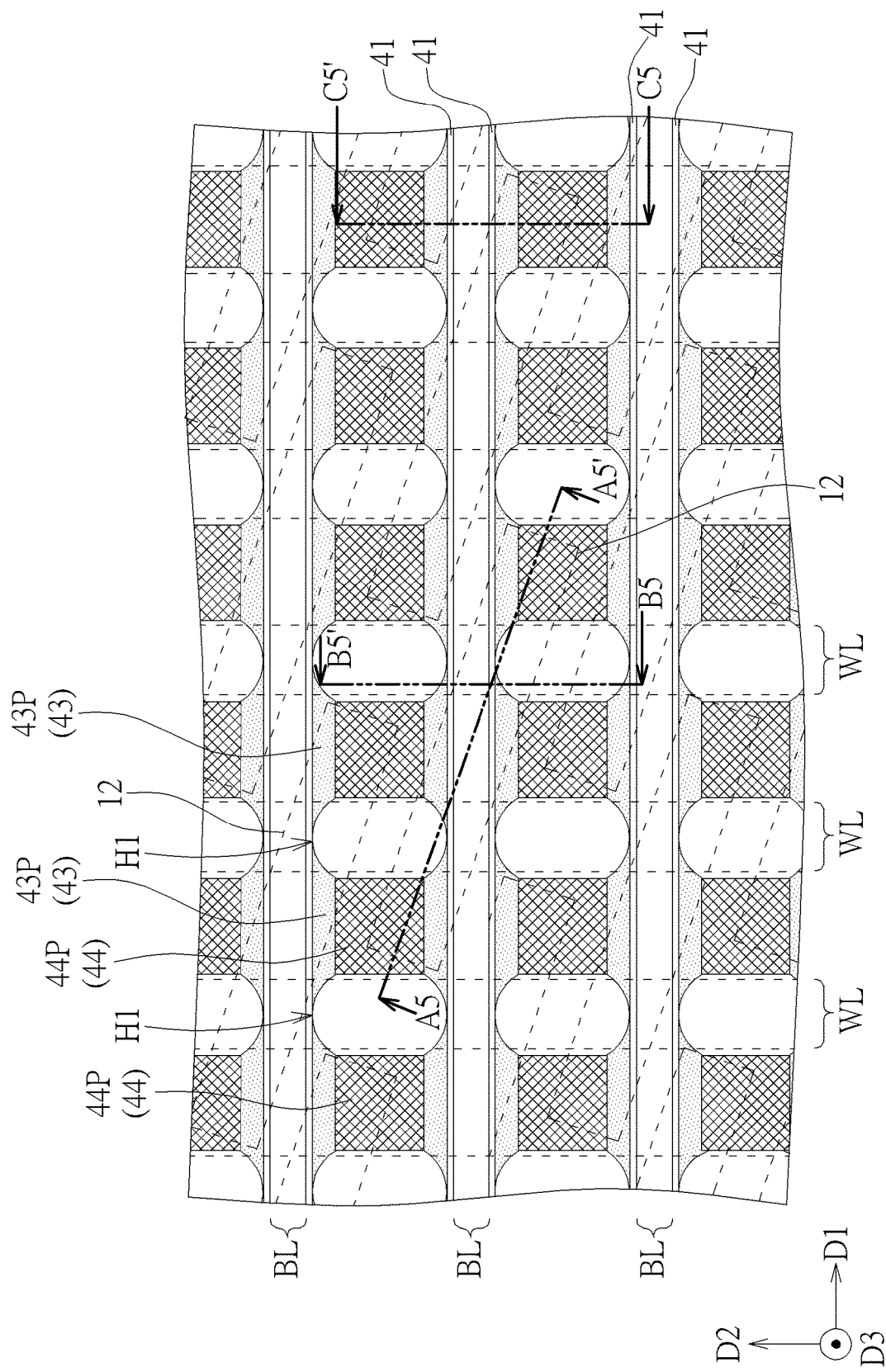
Figure 15:
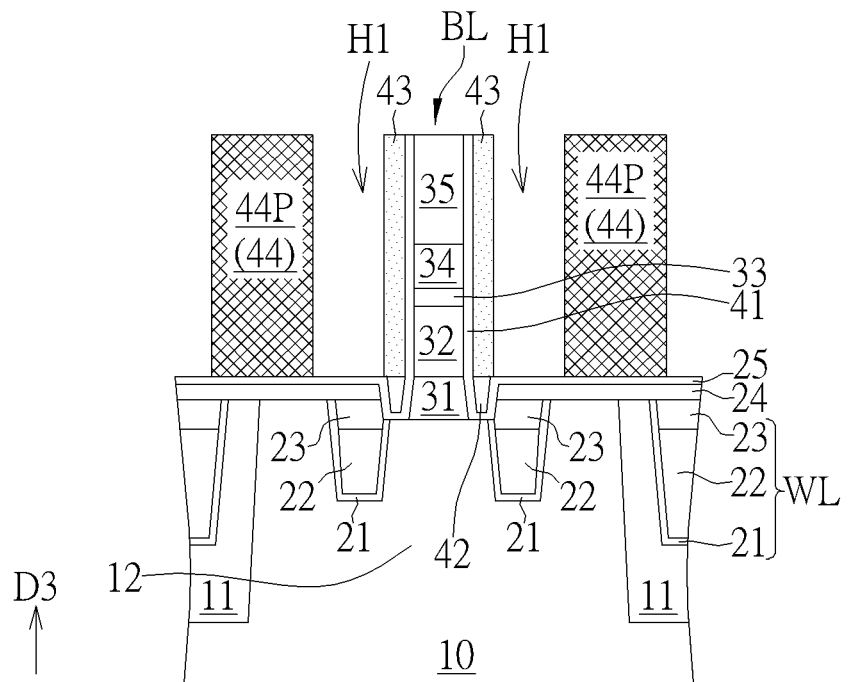
Figure 16:
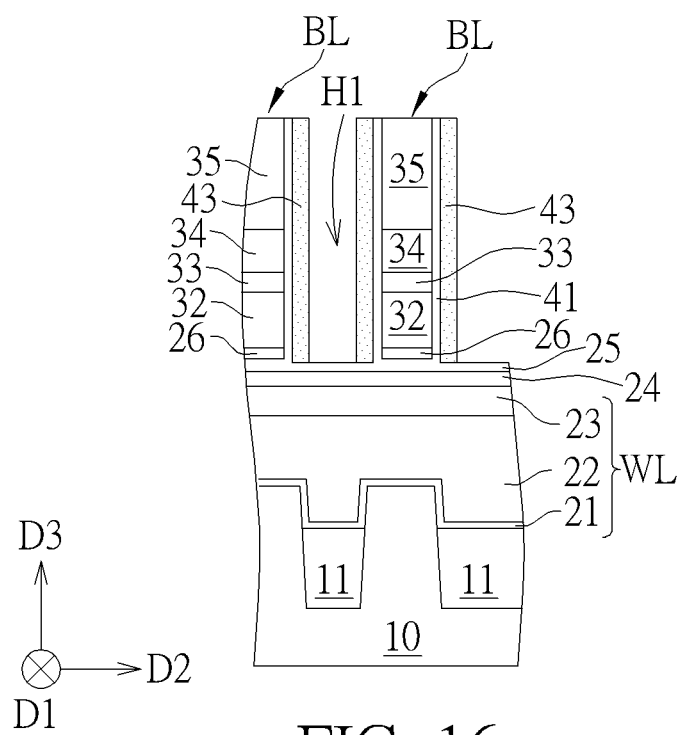
Figure 17:
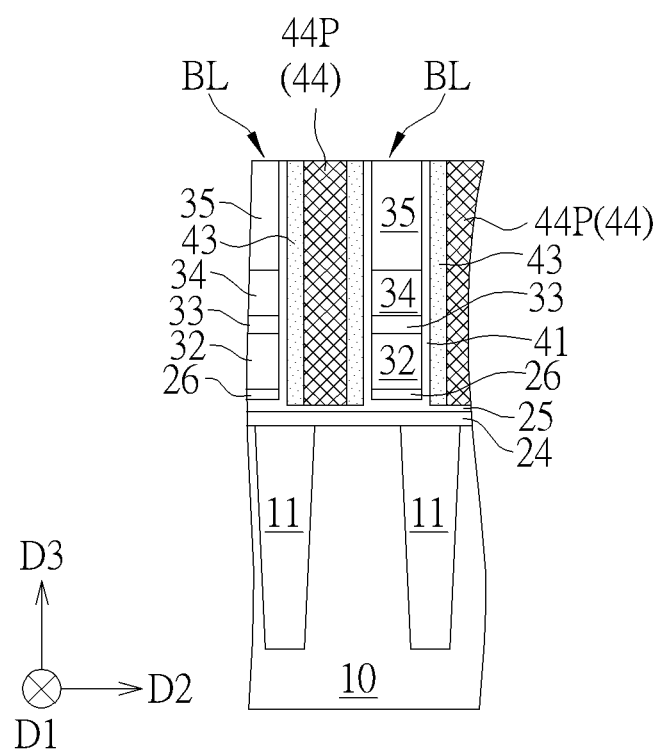
Figure 18:
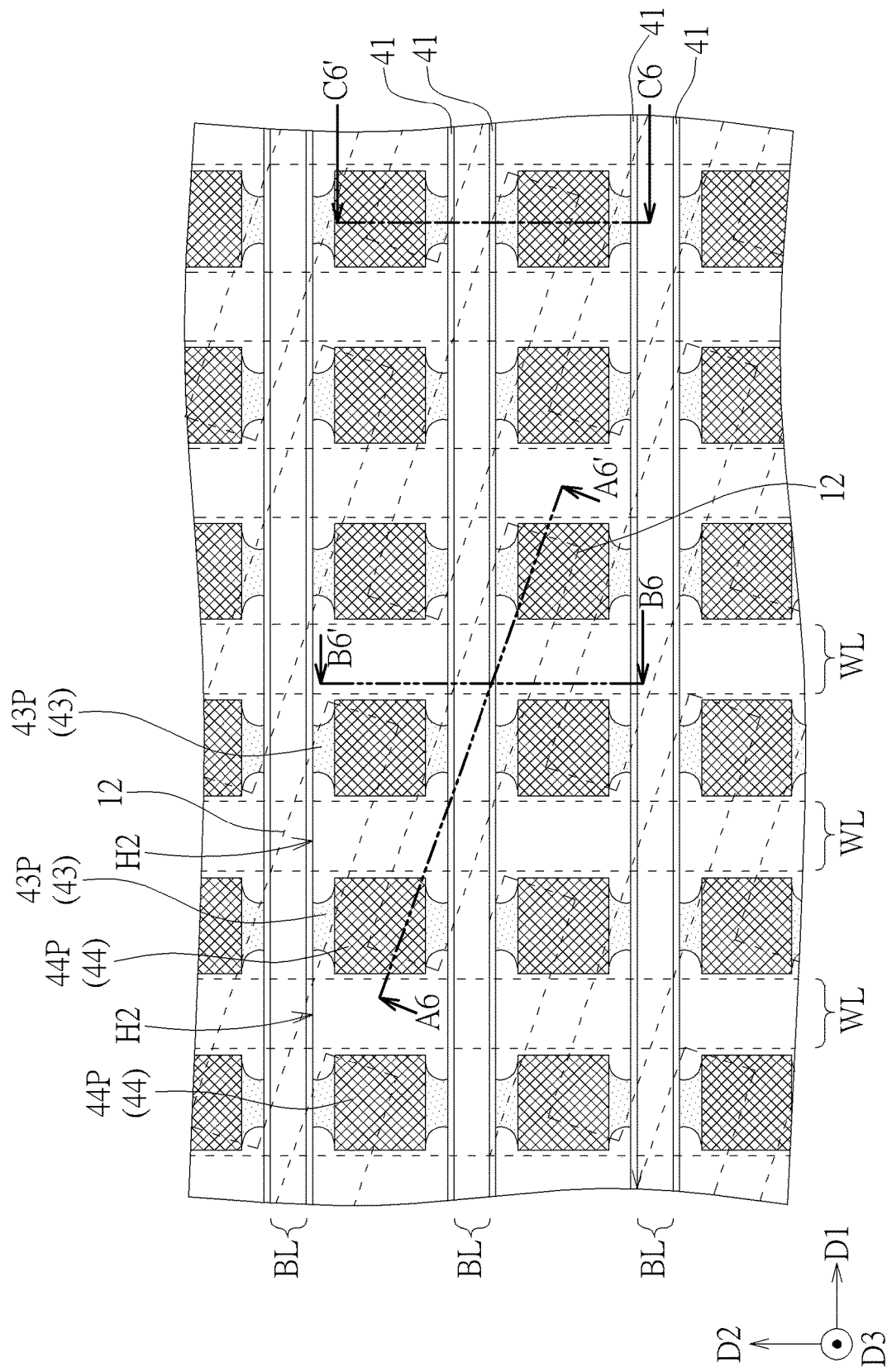
Figure 19:
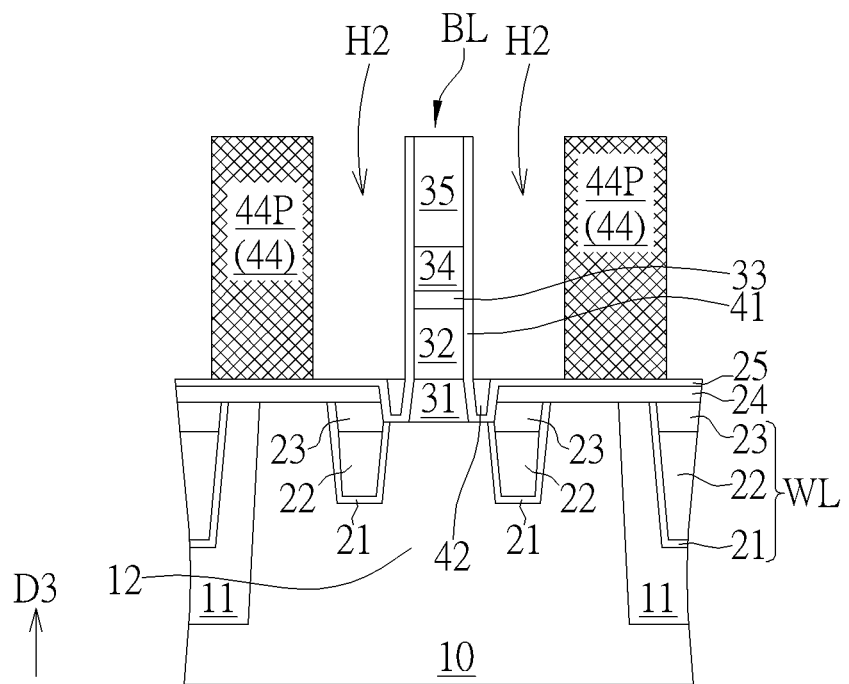
Figure 20:
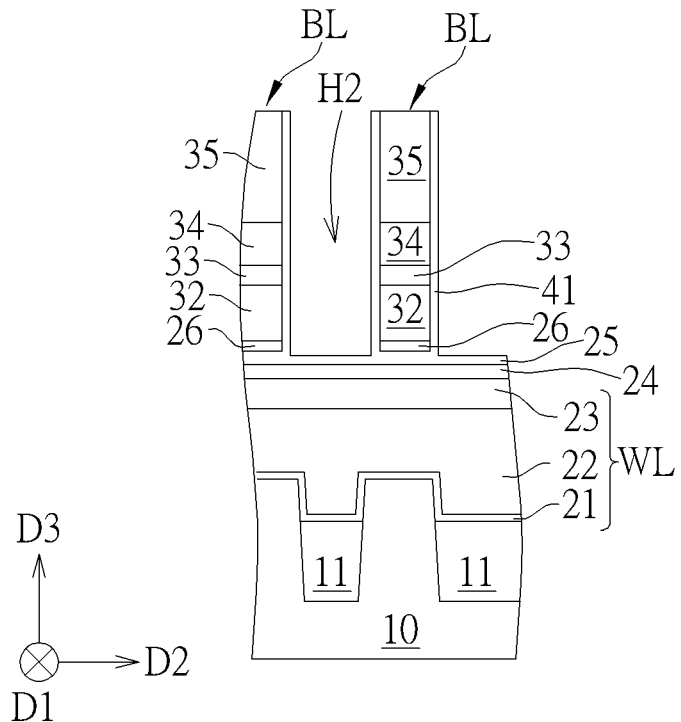
Figure 21:
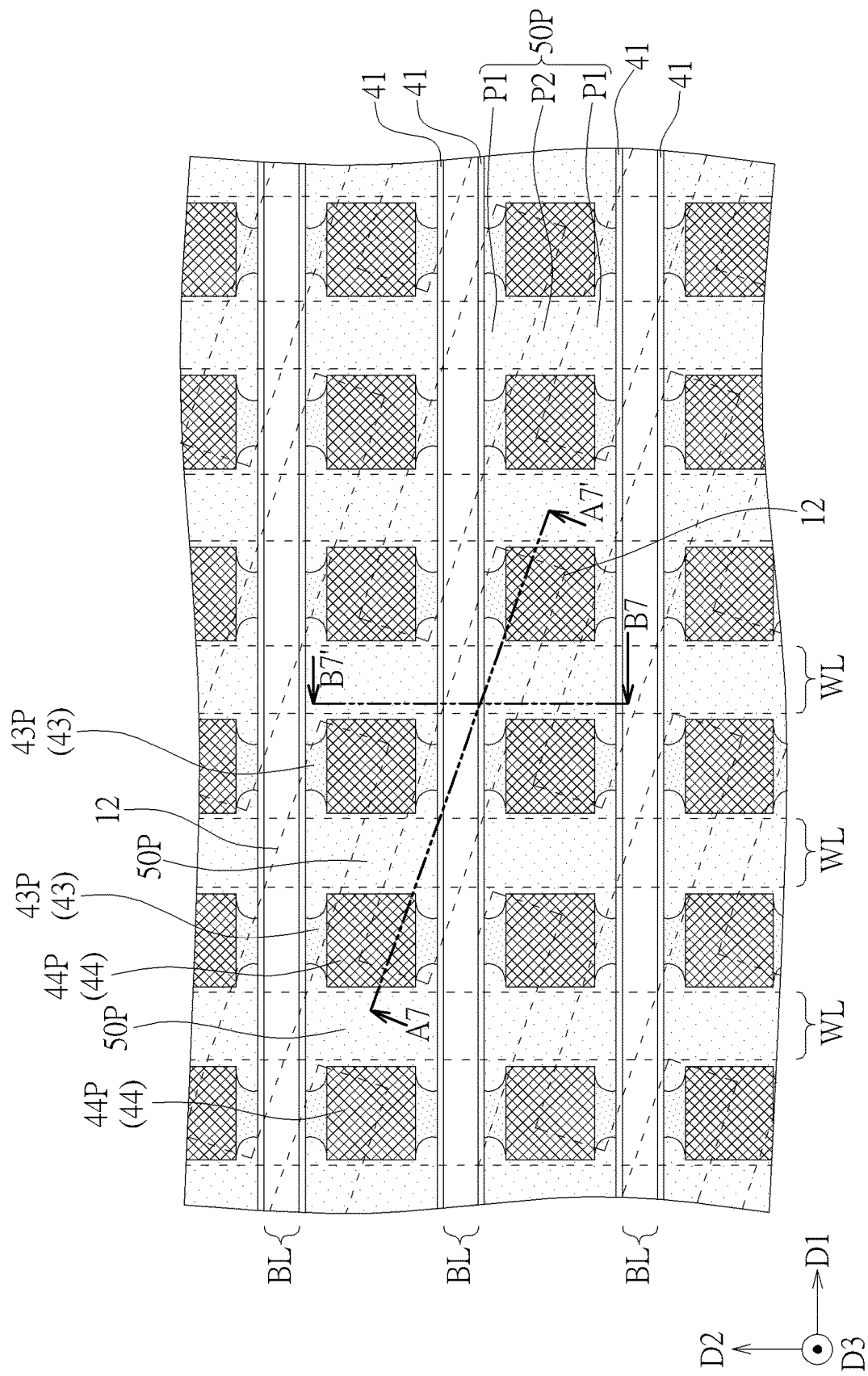
Figure 22:
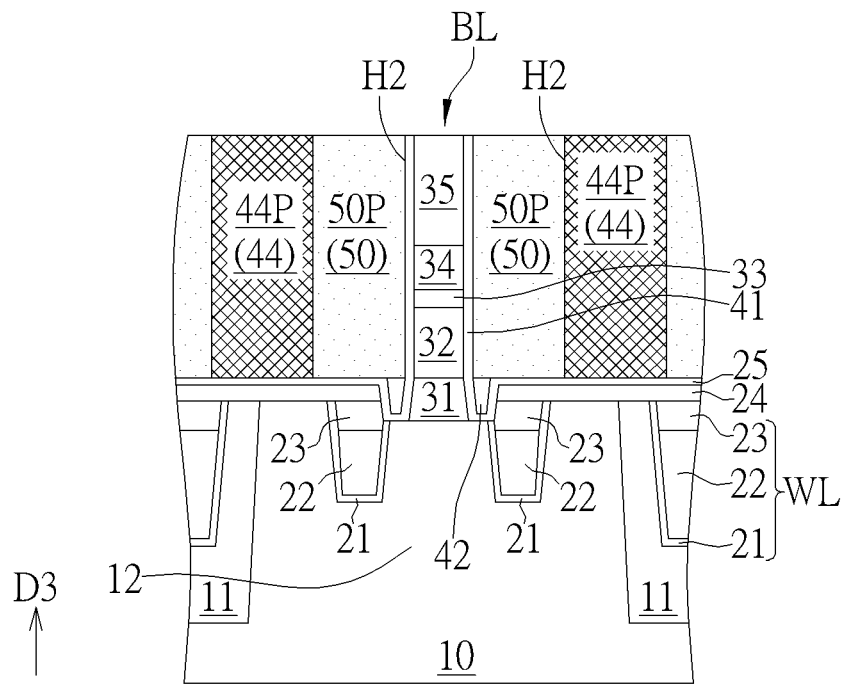
Figure 23:
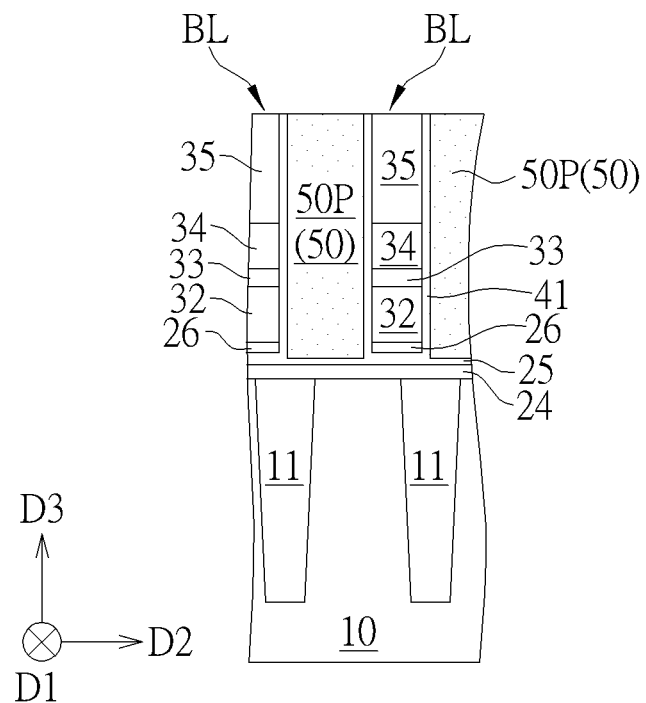
Figure 24:
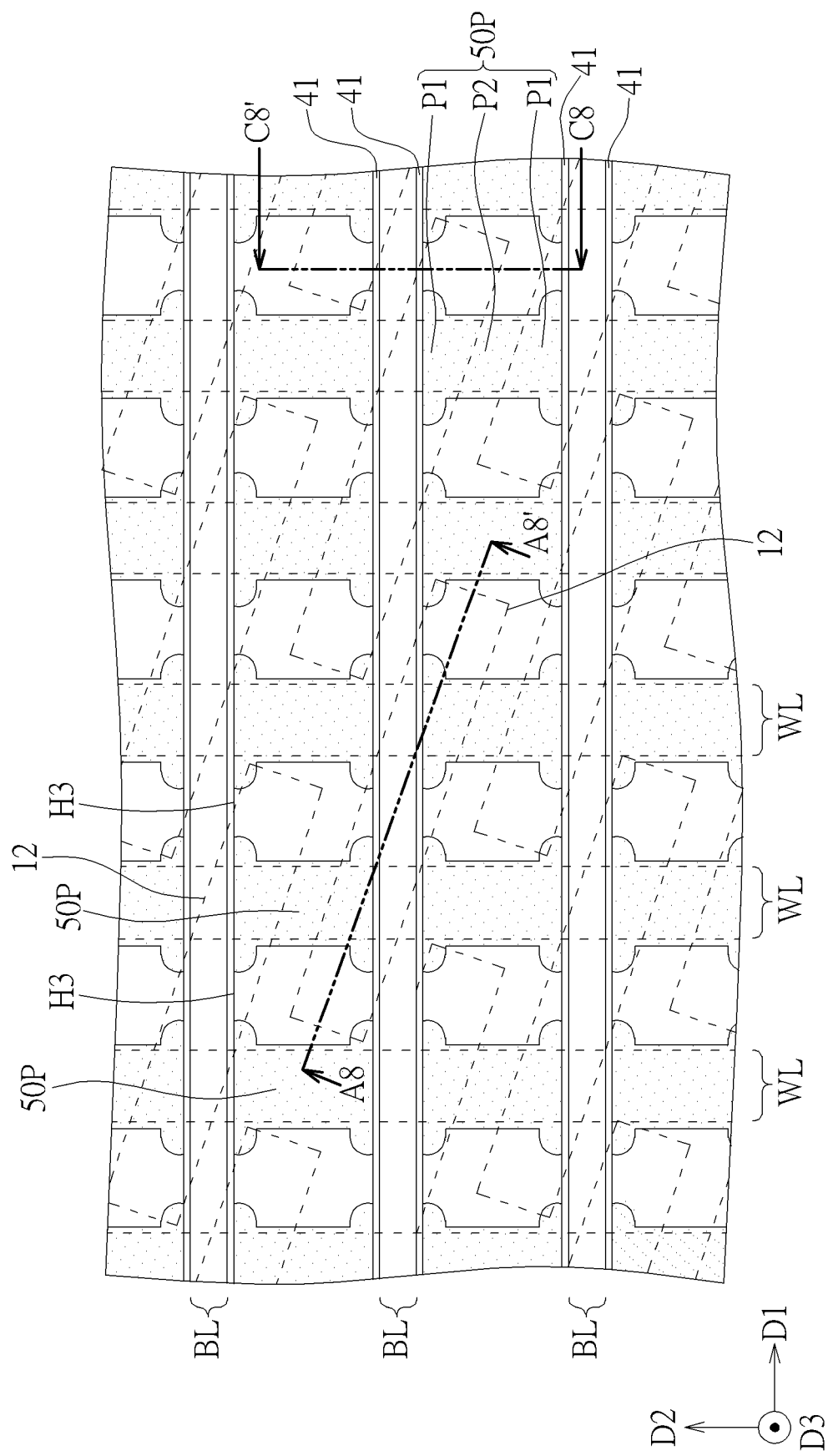
Figure 25:
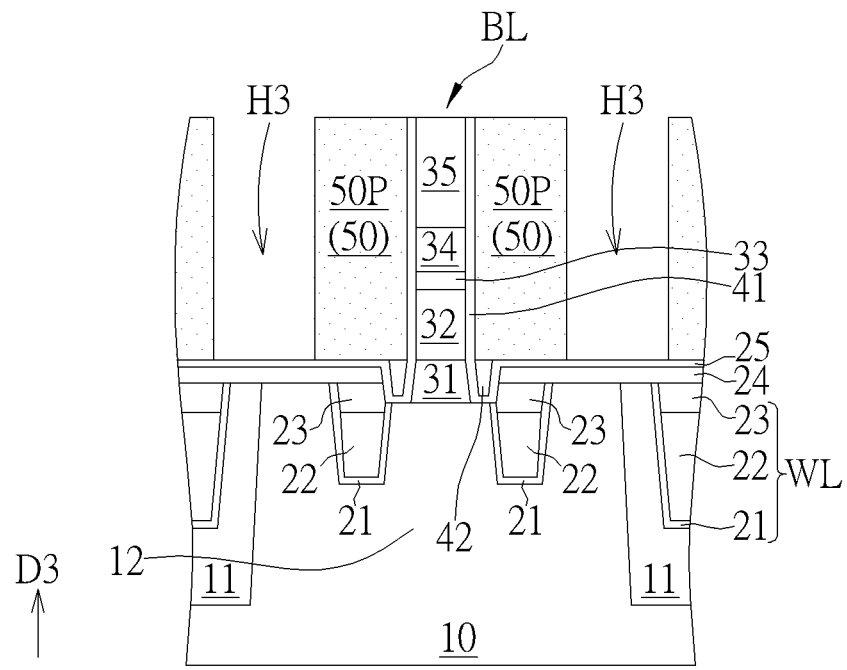
Figure 26:
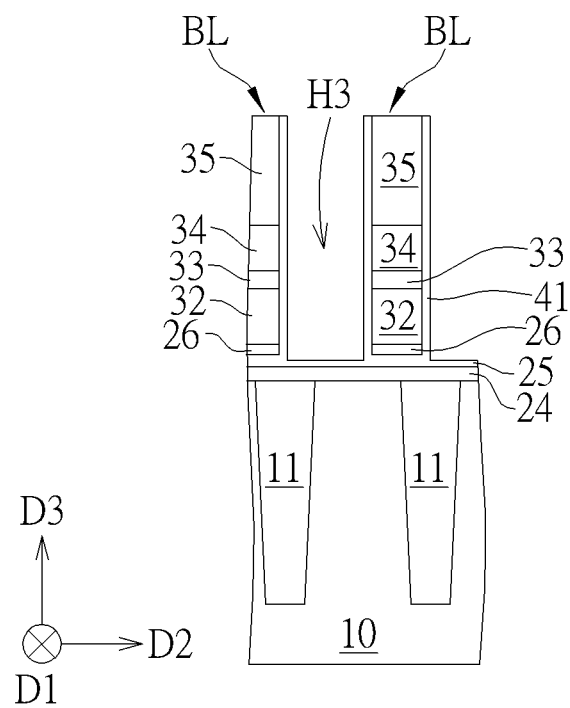

Specifically, the manufacturing method of the semiconductor device 100 in this embodiment may include but is not limited to the following steps. As shown in FIGS. 5-7, the bit line structure BL is formed after the step of forming the contact hole CH partially exposing the active region 12. In some embodiments, the bit line structure BL may further include a second bit line cap layer 36 disposed on the first bit line cap layer 35. As shown in FIGS. 8-10, the first spacer layer 41 and the second spacer layer 42 are conformally formed, and an etching back process is performed to the second spacer layer 42. Subsequently, a sacrifice layer 43 is conformally formed. In some embodiments, the sacrifice layer 43 may include non-metal materials such as polysilicon and silicon oxide or metal materials such as titanium nitride. Subsequently, as shown in FIGS. 11-13, an etching back process is performed to remove a part of the sacrifice layer 43, and the sacrifice layer 43 may be formed on the sidewalls of the bit line structures BL after the etching back process. In some embodiments, the above mentioned etching back process may be stopped at the second mask layer 25, but not limited thereto. In some embodiments, the above mentioned etching back process may also be stopped at the word line cap layer 23 and the active region 12 according to other considerations. Subsequently, a dielectric layer 44 may be formed between the bit line structures BL, and the sacrifice layer 43 may be located between the dielectric layer 44 and each of the bit line structures BL. After the step of forming the dielectric layer 44, a planarization process such as a chemical mechanical polishing (CMP) process may be formed, and the topmost surfaces of the dielectric layer 44, the sacrifice layer 43 and the bit line structures BL may be substantially coplanar after the planarization process, but not limited thereto. In some embodiments, the dielectric layer 44 may include spin on dielectric (SOD) or other dielectric materials having great gap-filling ability.

As shown in FIGS. 14-17, a patterning process is performed for forming a plurality of first openings H1. Each of the first openings H1 may penetrate the dielectric layer 44 and the sacrifice layer 43 in the third direction D3, and each of the first openings H1 exposes a part of the sacrifice layer 43. In some embodiments, each of the first openings H1 may have a rounded rectangle in a top view diagram (such as FIG. 14), but not limited thereto. In some embodiments, the dielectric layer 44 may be divided into dielectric patterns 44P separated from one another by the first openings H1, the sacrifice layer 43 may be divided into sacrifice patterns 43P separated from one another by the first openings H1, and a length of each of the sacrifice patterns 43P in the first direction D1 may be longer than a length of each of the dielectric patterns 44P in the first direction D1, but not limited thereto.

Subsequently, as shown in FIGS. 14-20, an etching process is performed to partially remove the sacrifice layer 43 located between the dielectric layer 44 and each of the bit line structures BL, and each of the first openings H1 is expanded to become a second opening H2 by the etching process. Therefore, the length of each of the sacrifice patterns 43P in the first direction D1 may be shorter than the length of each of the dielectric patterns 44P in the first direction D1 after the etching process mentioned above, and each of the second openings H2 may be an I-shaped opening in a top view diagram (such as FIG. 18), but not limited thereto. The etching process mentioned above may include an isotropic etching process, and etching process may have higher etching selectivity between the sacrifice layer 43 and other parts. For example, the etching process mentioned above may include a wet etching process, such as a SPM etching process using an etchant including a mixture of sulfuric acid ($H_2SO_4$), hydrogen peroxide, and deionized wafer and etching processes using hydrofluoric acid (HF), ammonia ($NH_3$), and/or hydrochloric acid (HCl), but not limited thereto. Additionally, during the etching process mentioned above, a mask (not shown) for forming the first openings H1 may still cover the sacrifice layer 43 and the dielectric layer 44 in the third direction D3, and the etching process may start at the sacrifice layer 43 exposed by the first openings H1. By controlling the etching rate and the etching time of the etching process, the sacrifice layer 43 located between the dielectric layer 44 and each of the bit line structures BL may not be completely removed and may become the condition shown in FIG. 18 after the etching process. Additionally, because the mask for forming the first openings H1 may still cover the sacrifice layer 43 and the dielectric layer 44 during the etching process mentioned above, a cross-sectional diagram taken along a line C6-C6' in FIG. 18 may be identical to a cross-sectional diagram taken along a line C5-C5' in FIG. 14 (i.e. FIG. 17), but not limited thereto.

As shown in FIGS. 18-23, the second openings H2 are then filled with an isolation material 50, and an etching back process is performed for forming the isolation structures 50 separated from one another. In some embodiments, the isolation material 50 may include nitride or other materials having higher etching selectivity to the sacrifice layer 43 and the dielectric layer 44. Each of the isolation structures 50P may influenced by the second opening H2 and have an I-shaped structure in a top view diagram (such as FIG. 21), but not limited thereto. In other words, in each of the isolation structures 50P, the first portion P1 elongated in the first direction D1 and connected with the sacrifice patterns 43P may be formed by the above mentioned approach which further etch the sacrifice patterns 43P. Subsequently, as shown in FIGS. 21-26, after the step of filling the second openings H2 with the isolation material 50, the sacrifice layer 43 and the dielectric layer 44 are removed for forming a plurality of third openings H3. In some embodiments, the method of removing the sacrifice layer 43 and the dielectric layer 44 may include a wet etching process, such as a SPM etching process or an etching process using ammonia as an etchant, but not limited thereto.

Figure 27:
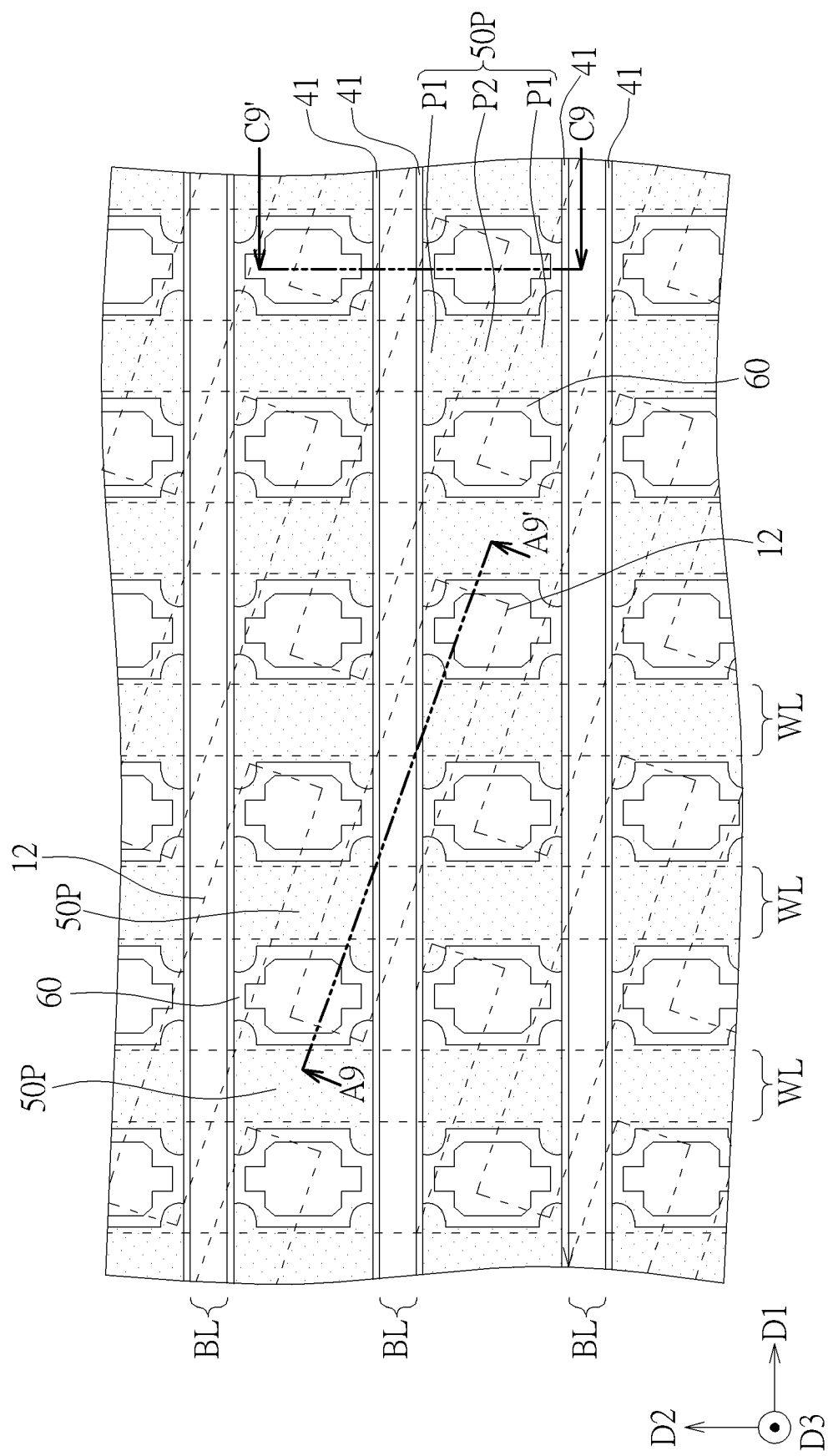
Figure 28:
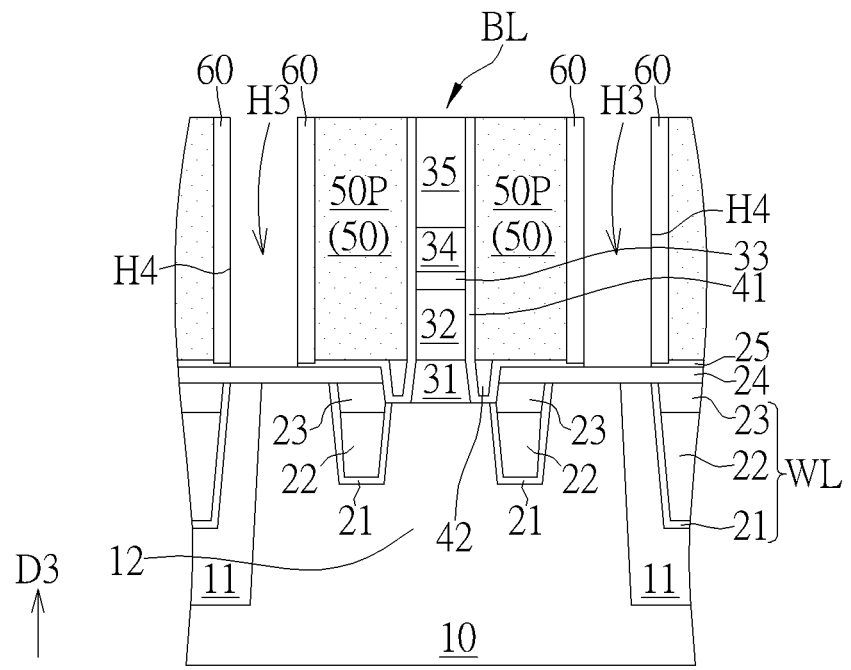
Figure 29:
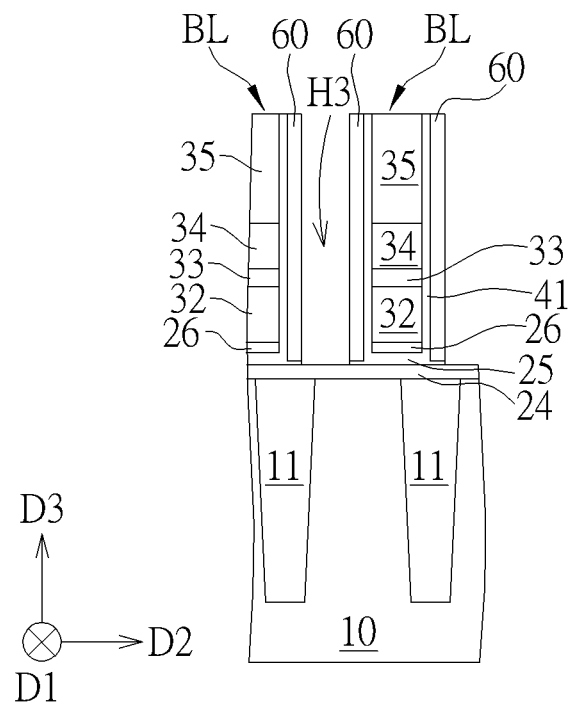
Figure 30:
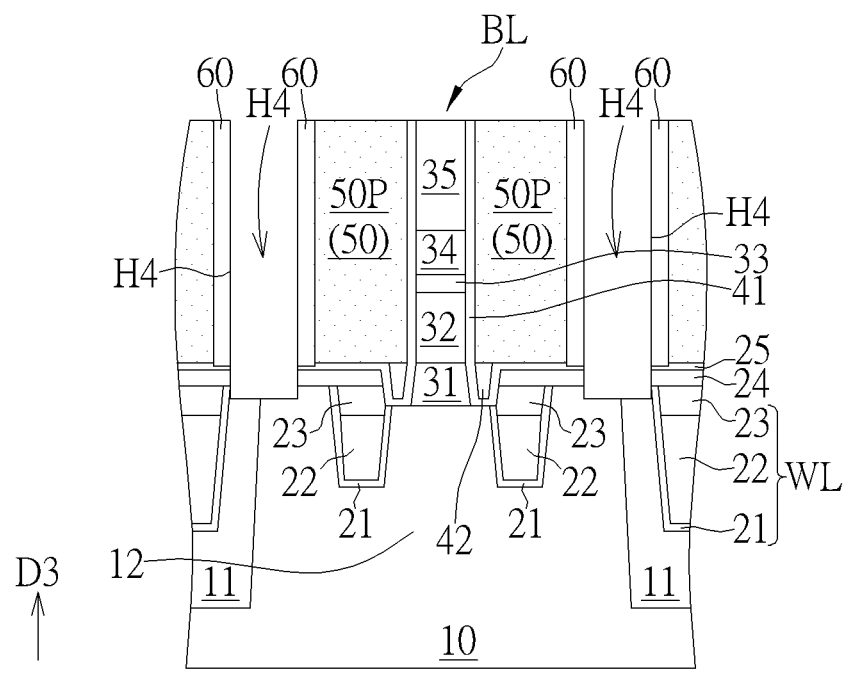
Figure 31:
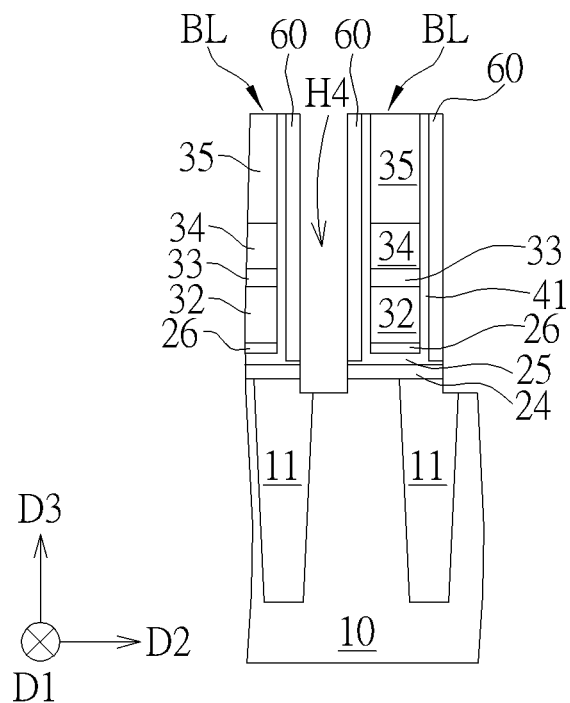

As shown in FIGS. 27-29, the liner 60 is then formed in the third openings H3. The liner 60 may include a single layer or multiple layers of insulation material, such as silicon oxide, silicon nitride, or other suitable insulation materials. In addition, the liner 60 may be formed by forming the above mentioned insulation material conformally in the third openings and on the isolation structures 50P and the bit line structures BL and performing an etching back process to remove the insulation material at the bottom of the third openings H3 and the insulation material above the isolation structures 50P and the bit line structures BL, but not limited thereto. Subsequently, as shown in FIGS. 27-31, a plurality of fourth openings H4 may be formed by further etching downwards from the third openings H3 for exposing the corresponding active regions 12. In other words, each of the fourth openings H3 may be surrounded by the liner 60 and partially expose the corresponding active region 12. As shown in FIGS. 1-4, the storage node contacts SC are then formed in the fourth openings H4. It is worth noting that, by the manufacturing method in this embodiment, there may be only two insulation layers, such as the first spacer layer 41 and the liner 60, disposed between each of the storage node contacts SC and the bit line structure BL adjacent to this storage node contact SC, but not limited thereto. The structure of the insulation layer between each of the storage node contacts SC and the bit line structure BL adjacent to this storage node contact SC is simplified for avoiding etching damages of the etching process for forming the fourth openings H4 on the insulation layer structure between each of the storage node contacts SC and the bit line structure BL adjacent to this storage node contact SC, and the manufacturing yield may be improved accordingly.

To summarize the above descriptions, according to the semiconductor memory device and the manufacturing method thereof in the present invention, the sacrifice layer may be used to increase the etching margin in the step of forming the openings corresponding to the isolation structures and form the isolation structures having the portions partially elongated to be disposed between the bit line structure and the storage node contact. The purpose of reducing the parasite capacitance between the bit line structure and the storage node contact may be achieved accordingly. In addition, the storage node contact formed by the manufacturing method of the present invention may include the protruding portions extending towards the bit line structures, and the distance between the main portion of the storage node contact and the bit line structure adjacent to the storage node contact may be increased by the isolation structures for reducing the parasite capacitance between the bit line structure and the storage node contact also.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   providing a semiconductor substrate;
   forming bit line structures on the semiconductor substrate, wherein each of the bit line structures is elongated in a first direction, and the bit line structures are repeatedly disposed in a second direction;
   forming storage node contacts on the semiconductor substrate, wherein each of the storage node contacts is disposed between the bit line structures disposed adjacent to each other in the second direction; and
   forming isolation structures on the semiconductor substrate, wherein each of the isolation structures is disposed between two of the bit line structures disposed adjacent to each other in the second direction, each of the storage node contacts is disposed between two of the isolation structures disposed adjacent to each other in the first direction, and each of the isolation structures comprises at least one first portion elongated in the first direction and partially disposed between one of the bit line structures disposed adjacent to the isolation structure and one of the storage node contacts disposed adjacent to the isolation structure in the second direction, wherein the step of forming the isolation structures comprises:
   forming a sacrifice layer on sidewalls of the bit line structures;
   forming a dielectric layer between the bit line structures after the step of forming the sacrifice layer, wherein the sacrifice layer is located between the dielectric layer and each of the bit line structures;
   forming first openings penetrating the dielectric layer and exposing a part of the sacrifice layer;
   performing an etching process to partially remove the sacrifice layer located between the dielectric layer and each of the bit line structures, wherein each of the first openings is expanded to become a second opening by the etching process;
   filling the second openings with an isolation material; and
   removing the sacrifice layer and the dielectric layer after the step of filling the second openings with the isolation material.

2. The manufacturing method of the semiconductor memory device according to claim 1, wherein the dielectric layer is divided into dielectric patterns separated from one another by the first openings, the sacrifice layer is divided into sacrifice patterns separated from one another by the first openings, and a length of each of the sacrifice patterns in the first direction is longer than a length of each of the dielectric patterns in the first direction.

3. The manufacturing method of the semiconductor memory device according to claim 2, wherein, the length of each of the sacrifice patterns in the first direction is shorter than the length of each of the dielectric patterns in the first direction after the etching process.

4. The manufacturing method of the semiconductor memory device according to claim 1, wherein each of the isolation structures comprises two first portions and a second portion disposed between the two first portions in the second direction.

5. The manufacturing method of the semiconductor memory device according to claim 4, wherein a length of each of the first portions in the first direction is longer than a length of the second portion in the first direction.

6. The manufacturing method of the semiconductor memory device according to claim 1, wherein each of the storage node contacts comprises:
   a main portion; and
   two protruding portions disposed at two opposite sides of the main portion in the second direction respectively, wherein each of the protruding portions extends towards one of the bit line structures disposed adjacent to the storage node contact.

7. The manufacturing method of the semiconductor memory device according to claim 6, wherein each of the protruding portions of each of the storage node contacts is partially disposed between the first portions of two of the isolation structures disposed adjacent to the storage node contact in the first direction.

* * * * *